(12) United States Patent
Matsuo et al.

(10) Patent No.: US 11,158,490 B2
(45) Date of Patent: Oct. 26, 2021

(54) PROCESSING METHOD IN PROCESSING APPARATUS USING HALOGEN-BASED GAS

(71) Applicant: TOKYO ELECTRON LIMITED, Tokyo (JP)

(72) Inventors: Tomohito Matsuo, Yamanashi (JP); Hiroshi Nagaike, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/775,606

(22) PCT Filed: Oct. 3, 2016

(86) PCT No.: PCT/JP2016/079249
§ 371 (c)(1),
(2) Date: May 11, 2018

(87) PCT Pub. No.: WO2017/081953
PCT Pub. Date: May 18, 2017

(65) Prior Publication Data
US 2018/0323046 A1    Nov. 8, 2018

(30) Foreign Application Priority Data

Nov. 12, 2015   (JP) .............................. JP2015-222244

(51) Int. Cl.
| | |
|---|---|
| *H01J 37/32* | (2006.01) |
| *C23C 16/44* | (2006.01) |
| *H01L 21/3213* | (2006.01) |
| *H01L 21/3065* | (2006.01) |
| *C23G 5/00* | (2006.01) |
| *C23F 4/00* | (2006.01) |
| *H01L 21/67* | (2006.01) |

(52) U.S. Cl.
CPC .... *H01J 37/32862* (2013.01); *C23C 16/4401* (2013.01); *C23C 16/4405* (2013.01);
(Continued)

(58) Field of Classification Search
None
See application file for complete search history.

(56) References Cited

U.S. PATENT DOCUMENTS 6,003,526 A * 12/1999 Lo ..................... H01L 21/67028
134/1.1
6,443,165 B1 * 9/2002 Akahori .............. C23C 16/4405
134/1.1
(Continued)

FOREIGN PATENT DOCUMENTS

| JP | H11-003867 A | 1/1999 |
|---|---|---|
| JP | 2004-111811 A | 4/2004 |

(Continued)

OTHER PUBLICATIONS

International Search Report dated Nov. 15, 2016.

*Primary Examiner* — Jiong-Ping Lu
(74) *Attorney, Agent, or Firm* — Fenwick & West LLP

(57) ABSTRACT

A processing apparatus performs a predetermined process on an object to be processed by supplying halogen-based gas into a chamber in which a vacuum is maintained, to which chamber a member having an oxide film formed on a surface thereof is connected, or which chamber has an oxide film formed on a surface thereof, wherein the predetermined processing is performed on the target object once or a plurality of times in the chamber. Later, oxygen gas or dry air is supplied to the chamber to purge the chamber, and then the chamber is opened and exposed to the atmosphere.

12 Claims, 8 Drawing Sheets

(52) U.S. Cl.
CPC ............ *C23C 16/4408* (2013.01); *C23F 4/00* (2013.01); *C23G 5/00* (2013.01); *H01J 37/3244* (2013.01); *H01J 37/3288* (2013.01); *H01J 37/32449* (2013.01); *H01J 37/32834* (2013.01); *H01L 21/3065* (2013.01); *H01L 21/32135* (2013.01); *H01L 21/32136* (2013.01); *H01L 21/67069* (2013.01); *H01J 2237/022* (2013.01)

(56) References Cited

U.S. PATENT DOCUMENTS

| | | | |
|---|---|---|---|
| 2006/0011580 A1 | 1/2006 | Shimizu | |
| 2010/0154707 A1* | 6/2010 | Ishizuka | B08B 7/0035 118/696 |
| 2013/0099233 A1* | 4/2013 | Tochibayashi | H01L 21/02071 257/43 |
| 2013/0189800 A1* | 7/2013 | Ohashi | H01J 37/32449 438/5 |
| 2017/0008042 A1* | 1/2017 | Kim | B08B 9/00 |

FOREIGN PATENT DOCUMENTS

| | | |
|---|---|---|
| JP | 2006-012940 A | 1/2006 |
| JP | 2008-235830 A | 10/2008 |
| JP | 2009-513330 A | 4/2009 |
| KR | 10-2013-0086511 A | 8/2013 |
| WO | 2007/048995 A1 | 5/2007 |

\* cited by examiner

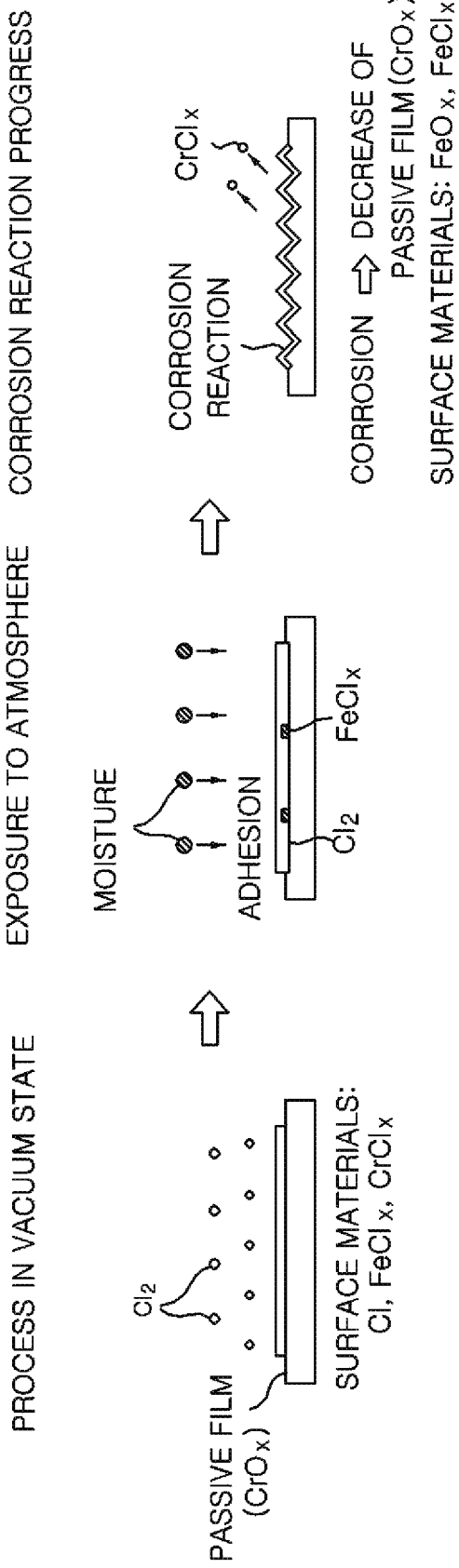

PROCESSING METHOD IN PROCESSING APPARATUS USING HALOGEN-BASED GAS

CROSS-REFERENCE TO RELATED APPLICATIONS

This application is a nation phase application of the PCT Application No. PCT/JP2016/079249, filed on Oct. 3, 2016, entitled "PROCESSING METHOD IN PROCESSING APPARATUS USING HALOGEN-BASED GAS," which claims priority to Japanese Patent Application No. 2015-222244, filed on Nov. 12, 2015. The entire contents of the foregoing patent applications are incorporated herein by reference for all purposes.

FIELD OF THE INVENTION

The present invention relates to a processing method in a processing apparatus using a halogen-based gas, such as an etching apparatus or the like.

BACKGROUND OF THE INVENTION

In a semiconductor device manufacturing process, a plasma etching process is performed while using a resist or the like as a mask in order to form a predetermined pattern on a predetermined layer formed on a semiconductor wafer as a target object.

Such a plasma etching process is performed by introducing a corrosive etching gas into a chamber of a plasma etching apparatus which is maintained in a vacuum state and converting the etching gas into plasma. In this plasma etching apparatus, it is necessary to perform a maintenance operation regularly and the chamber is opened to the atmosphere during the maintenance operation. However, when the chamber is opened and exposed to the atmosphere, reaction products in the chamber react with moisture in the air to generate harmful substances. Therefore, the chamber is purged before the chamber is opened and exposed to the atmosphere (see, e.g. "Background of the Invention" of Patent Document 1). A cycle purge is a process of repeating multiple times a cycle of increasing a pressure by introducing $N_2$ gas into the chamber, mixing $N_2$ gas with reaction products, evacuating the chamber, and introducing $N_2$ gas again.

In the plasma etching apparatus using $Cl_2$ gas or a halogen-based gas such as HBr or the like as an etching gas, if the wafer is processed after the chamber is opened and exposed to the atmosphere for the maintenance operation, metal contamination, mainly due to chromium, occurs on the wafer. Therefore, even after the chamber is opened and exposed to the atmosphere, $N_2$ purge or cycle purge is performed until the metal contamination becomes smaller than or equal to a reference value and, then, dummy wafer processing or the like is performed.

Patent Document 1: Japanese Patent Application Publication No. 2004-111811

It is considered that corrosion of a stainless steel pipe by a halogen-based gas causes the metal contamination of the wafer after the exposure to the atmosphere. Therefore, even when the dummy wafer processing is performed after the $N_2$ purge or the cycle purge is performed until the metal contamination becomes smaller than or equal to the reference value, it is after occurrence of the corrosion. Accordingly, since the purge requires a long period of time and the processing of several tens to several hundreds of dummy wafers is required, it takes about half a day to one day.

SUMMARY OF THE INVENTION

In view of the above, the present invention provides a processing method capable of suppressing corrosion caused by a halogen-based gas in a processing apparatus using the halogen-based gas.

In accordance with a first aspect of the present invention, there is provided a processing method in a processing apparatus, using a halogen-based gas, which performs a process on a target object by supplying a halogen-based gas into a chamber maintained in a vacuum state, the chamber having an oxide film on a surface thereof or being connected to a member having an oxide film on a surface thereof. The processing method includes: performing the process on a target object in the chamber once or multiple times; purging the chamber by supplying oxygen gas or dry air into the chamber; and exposing the chamber to the atmosphere.

In the processing method of the first aspect, an ion sputtering process may be performed together with or before the purging. The ion sputtering process may be performed by using argon ions obtained by generating a plasma of argon gas.

In accordance with a second aspect of the present invention, there is provided a processing method in a processing apparatus, using a halogen-based gas, which performs a process on a target object by supplying a halogen-based gas into a chamber while maintaining the chamber in a vacuum state, the chamber having an oxide film on a surface thereof or being connected to a member having an oxide film on a surface thereof. The processing method includes: performing the process on a target object in the chamber once or multiple times; processing an inside of the chamber by an oxygen plasma; and exposing the chamber to the atmosphere.

In accordance with a third aspect of the present invention, there is provided a processing method in a processing apparatus, using a halogen-based gas, which performs a process on a target object by supplying a halogen-based gas into a chamber maintained in a vacuum state, the chamber having an oxide film on a surface thereof or being connected to a member having an oxide film on a surface thereof. The processing method includes: performing the process on a target object in the chamber multiple times while maintaining the chamber in a vacuum state; and performing idling between the processes performed multiple times, wherein during the idling, oxygen gas or dry air is supplied into the chamber to purge the chamber.

In the processing method of the third aspect, the purging performed during the idling may be performed by the oxygen gas mixed with nitrogen gas. Further, the purging may be performed by oxygen gas for a predetermined period of the idling and the chamber is purged by nitrogen gas during a remaining period of the idling.

In the processing method of the first to third aspects, the member connected to the chamber, which has the oxide film on the surface thereof, may be a gas supply line made of stainless steel, and the oxide film may be an passive film made of chromium. Further, the halogen-based gas may be chlorine gas.

In accordance with the present invention, the oxide film can be reoxidized by oxygen gas, dry air, or an oxygen plasma and, thus, it is possible to suppress corrosion caused by a halogen-based gas in the processing apparatus using the halogen-based gas.

BRIEF DESCRIPTION OF THE DRAWINGS

FIGS. 3A to 3C schematically show an example of a reaction model of a passive film made of stainless steel by $Cl_2$ gas.

DETAILED DESCRIPTION OF THE EMBODIMENTS

In order to solve the above-described drawback, the present inventors have studied a corrosion mechanism of stainless steel.

A passive film ($Cr_2O_3$) is formed on a surface of stainless steel due to binding of chromium (Cr) contained in stainless steel and oxygen in the air. The passive film is stable and has high corrosion resistance against a halogen-based gas. However, it is clear that corrosion occurs in an environment where moisture exists due to reaction between moisture and a halogen-based gas. For example, in the case of using chlorine (Cl) as halogen, in an environment where a large amount of moisture exists at the time of exposure to the atmosphere, a passive film is destroyed by hydrochloric acid generated by reaction between water and chlorine and a large amount of chromium chloride ($CrCl_3$) is generated and the chloride is peeled off or volatilized from the surface of stainless steel and becomes particles or gas molecules causing metal contamination.

Even a destroyed passive film made of stainless steel is instantaneously reoxidized when oxygen exists. Therefore, it is clear that the chloride can be prevented from being peeled off or volatilized and becoming particles or gas molecules by instantaneously reoxidizing the passive film during the reaction between the hydrochloric acid and the passive film by supplying oxygen.

Accordingly, it is clear that the halogen-based component such as chlorine or the like in the gas supply line can be removed by purging the chamber by supplying oxygen gas or dry air into the chamber through the gas supply line before exposure to the atmospheric atmosphere where moisture exists. It is also clear that the passive film can be restored to the original good state and the corrosion by halogen hardly occurs in spite of contact with moisture due to the exposure to the atmosphere. In addition, it is clear that although the passive film is slightly corroded by the halogen-based gas even during the treatment using the halogen-based gas in a vacuum atmosphere, the passive film can be restored to the original good state and the corrosion by the halogen can be suppressed by purging the chamber by supplying oxygen gas or dry air into the chamber through the gas supply line during the idling between the processes using the halogen-based gas.

It is clear that the above effects can be obtained not only in the case of the passive film made of stainless steel used for the gas supply line but also in the case of films made of other oxides such as aluminum oxide ($Al_2O_3$), yttrium oxide ($Y_2O_3$) and the like which are formed on the surface of the gas supply line or the surface of the chamber.

The present invention has been conceived from the above conclusion.

Hereinafter, embodiments of the present invention will be described with reference to the accompanying drawings.

(Processing Apparatus)

Figure 1:
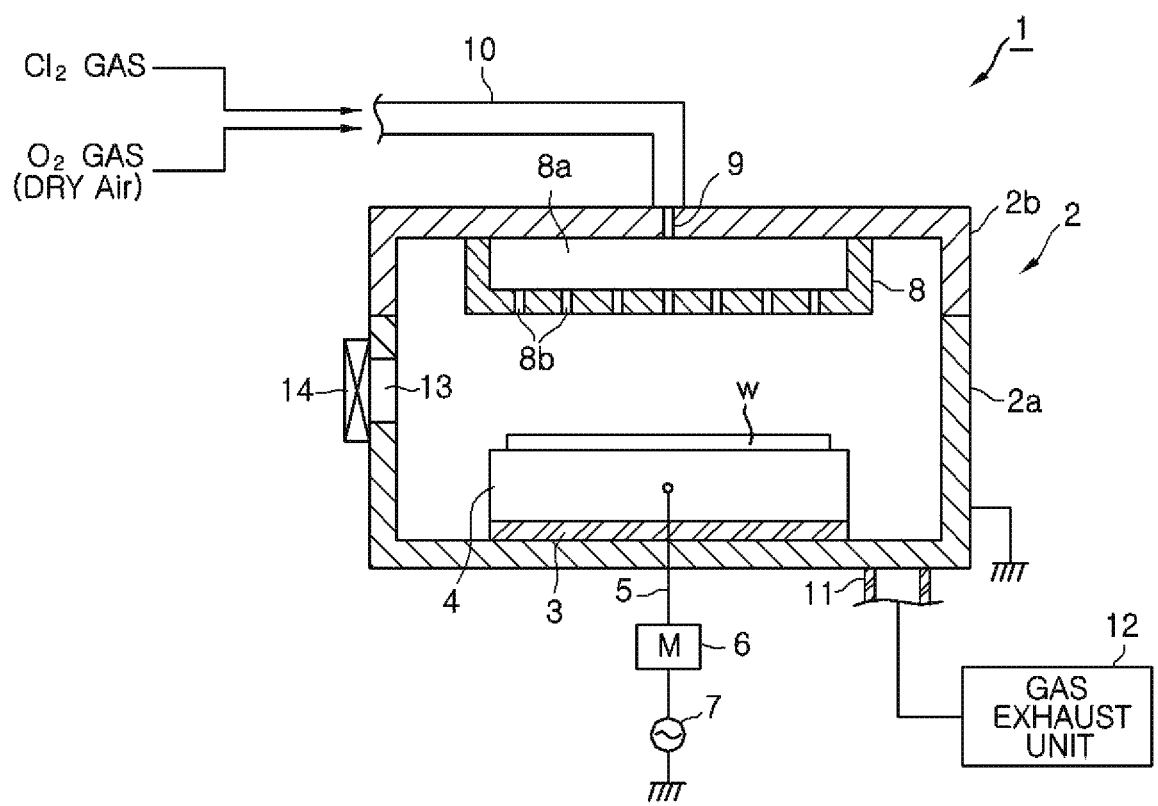
FIG. 1 is a cross sectional view showing an exemplary schematic configuration of a processing apparatus that can be used in a processing method according to an embodiment.

First, an example of a processing apparatus that can be used for a processing method according to an embodiment of the present invention will be described. FIG. 1 is a cross sectional view showing a schematic configuration of the processing apparatus.

A processing apparatus 1 shown in FIG. 1 is configured as a plasma etching apparatus. The processing apparatus 1 includes a chamber 2 for accommodating a semiconductor wafer (hereinafter, simply referred to as "wafer") W as a target object. The chamber 2 is grounded and has a main body 2a and an openable/closeable lid 2b provided on the main body 2a. The chamber 2 is made of aluminum having an anodically oxidized (alumite treated) surface.

A mounting table 4 serving as a lower electrode and configured to mount thereon the wafer W is provided on a bottom wall of the main body 2a of the chamber 2 via an insulating member 3. The mounting table 4 is connected to a power feed line 5. The power feed line 5 is connected to a matching unit 6 and a high frequency power supply 7. A high frequency power having a predetermined frequency is applied from the high frequency power supply 7.

The shower head 8 serving as an upper electrode and configured to introduce a gas into the chamber 2 is provided at an inner portion of the lid 2b of the chamber 2 to face the mounting table 4. The shower head 8 has therein a gas diffusion space 8a for diffusing a processing gas. A plurality of gas injection holes 8b is formed on a bottom portion of the shower head 8. The shower head 8 is grounded via the chamber 2. The shower head 8 and the mounting table 4 constitute a pair of parallel plate electrodes. Therefore, by applying a high frequency power from the high frequency power supply 7 to the mounting table 4, a high frequency electric field is generated between the mounting table 4 and the shower head 8 and plasma is generated in the chamber 2.

A gas inlet 9 is provided on an upper surface of the shower head 8. The gas inlet 9 is connected to a gas supply line 10 made of stainless steel. The gas supply line 10 is connected to a gas supply unit (not shown) and supplies $Cl_2$ gas that is a halogen-based gas serving as an etching gas and $O_2$ gas or dry air as a purge gas from the gas supply unit to the shower head 8. Further, other components of the etching gas, a dilution gas and the like are supplied from the gas supply unit. The $Cl_2$ gas as an etching gas is turned into plasma by the high frequency electric field, and a predetermined layer of the wafer W is etched.

A gas exhaust line 11 is connected to a bottom portion of the main body 2a of the chamber 2. The gas exhaust line is connected to a gas exhaust unit 12. A pressure control valve (not shown) is provided in the gas exhaust line 11. The gas exhaust unit 12 includes a vacuum pump such as a turbo molecular pump or the like and is configured to evacuate the chamber 2 to a predetermined vacuum level. A loading/unloading port 13 for loading/unloading the wafer W and a gate valve 14 for opening/closing the loading/unloading port 13 are provided at a sidewall of the main body 2a of the chamber 2. When the loading/unloading port 13 is opened, the wafer W can be loaded into and unloading from the chamber 2 by a transfer unit (not shown).

In the processing apparatus 1 configured as described above, the wafer W is loaded through the loading/unloading port 13 by the transfer unit (not shown) by opening the gate valve 14 and mounted on the mounting table 4. Then, the transfer unit is retreated from the chamber 2 and the gate valve 14 is closed.

In that state, a pressure in the chamber 2 is controlled to a predetermined vacuum level by the pressure control valve, and $Cl_2$ gas as an etching gas is supplied into the shower head 8 through the gas supply line 10 and $Cl_2$ gas is introduced into the chamber 2 from the shower head 8. By applying a high frequency power from the high frequency power supply 7 to the mounting table 4, a high frequency electric field is generated between the mounting table 4 and the shower head 8, and a plasma of $Cl_2$ gas as an etching gas is generated. Accordingly, a predetermined film of the wafer W is etched.

Processing Method According to First Embodiment of the Present Invention

In the case of repeatedly performing the plasma etching process on a plurality of wafers, reaction by-products are adhered to an inner portion of the chamber 2, the gas exhaust unit 12, or the like. Therefore, the chamber 2 is opened and exposed to the atmosphere and subjected to a maintenance operation at a regular interval by opening the lid 2b.

The reaction products in the chamber react with moisture in the air to generate harmful substances. Therefore, in a conventional case, the chamber is subjected to cycle purge by $N_2$ gas before exposure to the atmosphere. However, it is clear that even if the cycle purge is performed before exposure to the atmosphere, metal contamination occurs in a process of etching the wafer after the cycle purge. Therefore, $N_2$ purge or cycle purge are performed and, further, dummy wafer processing is performed before the start of the etching process. However, since the purge requires a long period of time and the processing of several tens to several hundreds of dummy wafers is required, it takes about half a day to one day.

The processing method of the embodiment is intended to solve such drawbacks.

Figure 2:
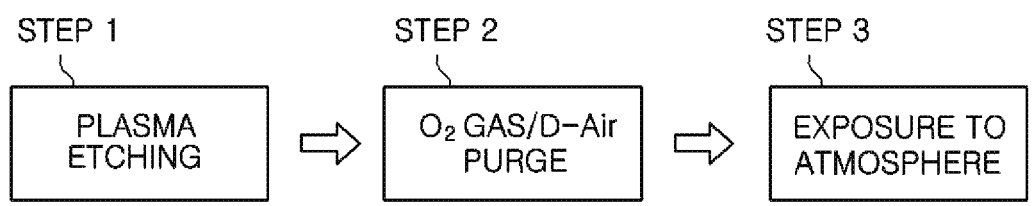
FIG. 2 is a flowchart showing a processing method according to a first embodiment of the present invention.

FIG. 2 is a flowchart showing the processing method according to the first embodiment of the present invention. In this example, the processing apparatus 1 performs the above-described plasma etching process once or multiple times (step 1). Then, the chamber 2 is purged by supplying oxygen gas ($O_2$ gas) or dry air (D-Air) into the chamber 2 through the gas supply line 10 (step 2). Thereafter, the chamber 2 is opened and exposed to the atmosphere (step 3). In other words, the chamber 2 is purged by using oxygen gas ($O_2$ gas or dry air), instead of the conventional cycle purge, before the exposure to the atmosphere after the etching process.

The gas supply line 10 made of stainless steel (SUS) is corroded due to $Cl_2$ remaining on an inner surface thereof. When the chamber is opened and exposed to the atmosphere in a state where $Cl_2$ remains on that surface, moisture in the air and $Cl_2$ react with the passive film. Therefore, the corrosion is promoted to cause metal contamination. On the other hand, in the present embodiment, by supplying oxygen gas ($O_2$ gas or dry air) into the chamber 2 through the gas supply line 10 to purge the chamber 2 before exposure to the atmosphere, it is possible to remove Cl components adhered to the gas supply line 10 before contact with moisture in air and also possible to restore the passive film to the original state by reoxidizing the passive film. Accordingly, it is possible to suppress the corrosion reaction during the exposure to the atmosphere and maintain the protection effect of the passive film in a subsequent process. As a consequence, the corrosion of the gas supply line 10 (consumption of Cr in the passive film) can be suppressed and, thus, it is not necessary to perform the purge and the dummy wafer processing requiring a long period of time as in the conventional case in a process after the exposure to the atmosphere.

In the case of using oxygen gas ($O_2$ gas) for the purge of the step 2, it is not limited to oxygen gas ($O_2$ gas) simple substance and may be mixed with an inactive gas ($N_2$ gas or a rare gas such as Ar gas or the like). However, it is more effective to use oxygen gas ($O_2$ gas) simple substance than to use dry air or a mixture of oxygen gas and and inactive gas. The purge in the step 2 may be performed for a few minutes to about 30 minutes before exposure to the atmosphere which is shorter than a period of time of the conventional cycle purge.

When moisture is contained in the oxygen gas or the like used in the purge of the step 2, the effect of reoxidation by oxygen deteriorates due to the action of water and Cl. Therefore, it is preferable to use a gas which contains substantially no moisture as the gas used for the purge (oxygen gas, dry air, or the like). In other words, it is preferable to remove moisture in the purge gas. According to International Technology Roadmap for Semiconductors (ITRS), a moisture concentration of a halogen-based gas is 0.5 ppm or less. In the present embodiment, when the concentration of moisture in the purge gas is smaller than that in the halogen-based gas, a constant effect is obtained. Therefore, it is preferable to set the concentration of moisture in the purge gas to 0.5 ppm or less.

(Corrosion Mechanisms and Corrosion Inhibition Mechanism)

As described above, the gas supply line 10 is made of stainless steel (SUS) and has high corrosion resistance due to the presence of the passive film formed on the surface thereof. However, under the environment containing moisture, $Cl_2$ gas as a halogen-based gas, water ($H_2O$) and the passive film ($CrO_x$) react as in the following reaction formulas (1) and (2), for example. As a result, the passive film is corroded.

$$Cl_2 + H_2O \Leftrightarrow HCl + HClO \tag{1}$$

$$CrO_x + HCl \Leftrightarrow CrCl_x + H_2O \tag{2}$$

In other words, hydrochloric acid (HCl) is generated by the reaction between chlorine gas ($Cl_2$) and water ($H_2O$), and chromium chloride ($CrCl_x$) is generated by the reaction between hydrochloric acid and the passive film ($CrO_x$).

FIGS. 3A to 3C schematically show an example of a reaction model of corrosion of a passive film made of stainless steel by $Cl_2$ gas. As shown in FIG. 3A, when $Cl_2$ gas is adhered to the passive film during the plasma etching process performed in a vacuum state, $FeCl_x$ generated by reaction between Fe and Cl and $CrCl_x$ generated by reaction between a small amount of moisture in the chamber and $Cl_2$ exist, in addition to the adhered Cl, as surface materials on the surface of the passive film.

When the chamber is opened and exposed to the atmosphere in that state, moisture in air is adhered to the surface of the passive film, as can be seen from FIG. 3B. Then, as shown in FIG. 3C, the passive film ($CrO_x$) is corroded by the adhered moisture and $Cl_2$ on the surface and becomes $CrCl_x$ or the like as in the reaction formulas (1) and (2). Due to the peeling off or the volatilization thereof, particles or gas molecules scatter and cause metal contamination, and a film thickness of the passive film is decreased. Further, the amount of $FeCl_x$ and $FeO_x$ as the surface materials is increased.

Figures 4A, 4B, 4C, 4D:
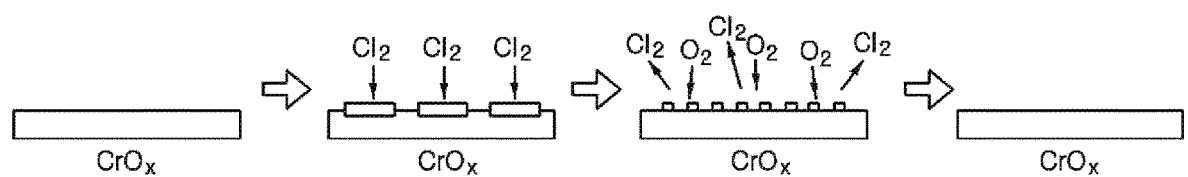
FIGS. 4A to 4D schematically show a corrosion inhibition model in the first embodiment.

On the other hand, the corrosion inhibition model in the present embodiment has mechanism shown in FIGS. 4A to 4D. In other words, when $Cl_2$ gas is adhered to the surface as shown in FIG. 4B in a state where the passive film ($CrO_x$) is formed on the surface as shown in FIG. 4A, $CrCl_x$ is generated locally. Therefore, Cl components such as $Cl_2$ or the like adhered to the surface are removed by performing a purge process using oxygen gas ($O_2$ gas) or dry air as shown in FIG. 4C before exposure to the atmosphere, and the original state is obtained by reoxidizing the passive film as shown in FIG. 4D. Accordingly, the corrosion of the passive film is suppressed.

According to Standard enthalpy of formation ($\Delta H_f^0$), the enthalpy of chromium oxide is greater on the negative side than that of chromium chloride and more stable as can be seen from Table 1. This also shows that Cr tends to become oxidized rather than chloridized in an environment where oxygen exists and halogen corrosion by chlorine can be suppressed by reoxidizing $CrCl_3$.

TABLE 1

| Compound | Standard enthalpy of formation ($\Delta H_f^0$) |
| --- | --- |
| $CrCl_3$ | −556.5 |
| $Cr_2O_3$ | −1139.7 |

Since, however, moisture promotes corrosion by halogen as described above, when moisture is contained in aqueous hydrochloric acid or in air such as the atmosphere, the effect of the moisture is considerable and it is difficult to obtain a desired effect only by supplying oxygen. Therefore, the purge process needs to be performed in an atmosphere of oxygen gas or an atmosphere, such as dry air, which contains oxygen gas and in which concentration of moisture is low. In order to completely remove the effect of the moisture, it is preferable to set an environment which contains substantially no moisture and set the concentration of moisture to 0.5 ppm or less as described above.

Processing Method According to Second Embodiment of the Present Invention

Next, a processing method according to a second embodiment of the present invention will be described.

Figure 5:
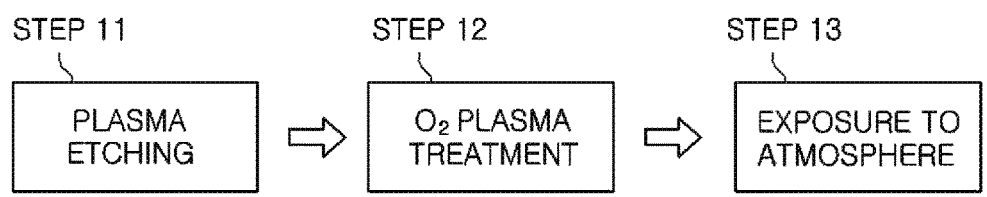
FIG. 5 is a flowchart showing a processing method according to a second embodiment of the present invention.

FIG. 5 is a flowchart showing the processing method according to the second embodiment of the present invention. In the present embodiment as well as the first embodiment, the processing apparatus 1 performs the above-described plasma etching process once or multiple times (step 11), and performs $O_2$ plasma processing by exposing the gas supply line 10 and the chamber 2 to an $O_2$ plasma instead of performing a purge process using oxygen gas or the like (step 12), and then opens the chamber 2 to be exposed to the atmosphere (step 13). The $O_2$ plasma processing can be performed by supplying the high frequency power from the high frequency power source 7 to the mounting table 4 while supplying oxygen gas into the chamber 2 through the gas supply line 10. There may be employed a remote plasma generating method in which an $O_2$ plasma generated by separate mechanism is introduced into the chamber 2 through the gas supply line 10.

Figures 6A, 6B, 6C, 6D:
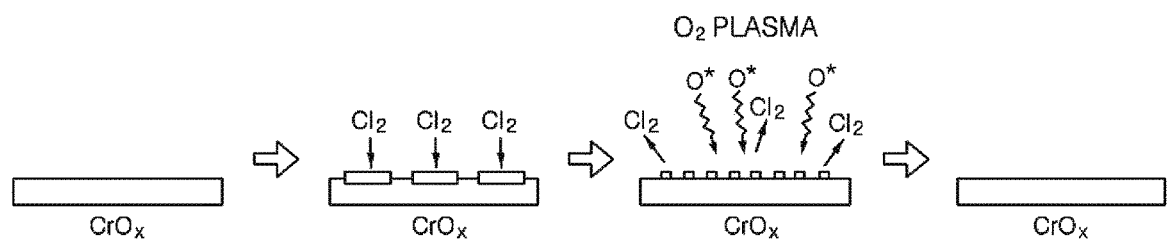
FIGS. 6A to 6D schematically show a corrosion inhibition model in the second embodiment.

FIGS. 6A to 6C show the corrosion inhibition model of the present embodiment. In other words, when $Cl_2$ gas is adhered to the surface as shown in FIG. 6B in a state where the passive film ($CrO_x$) is generated as shown in FIG. 6A, $CrCl_x$ is generated locally. Therefore, the chamber is exposed to the $O_2$ plasma as shown in FIG. 6C before exposure to the atmosphere and the Cl component on the surface is removed by O radicals (O*). Also, the original state is obtained by reoxidizing the passive film by utilizing the oxidation effect of O radical as shown in FIG. 6C. Due to the higher reactivity of the O radicals than that of $O_2$, a higher effect can be obtained in a short period of time and the reoxidation can be completed within 30 seconds which is a short period of time.

Processing Method According to Third Embodiment of the Present Invention

Next, a processing method according to a third embodiment of the present invention will be described.

Figure 7:
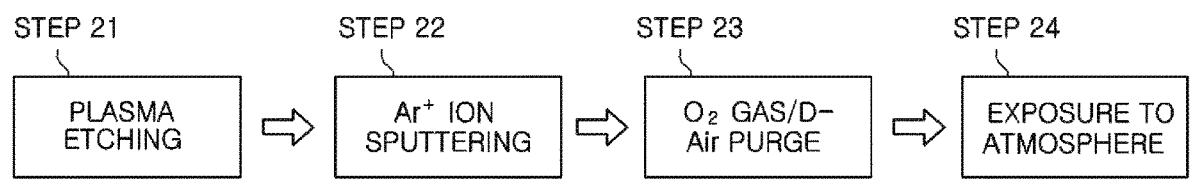
FIG. 7 is a flowchart showing a processing method according to a third embodiment of the present invention.

FIG. 7 is a flowchart showing the processing method according to the third embodiment of the present invention. In the present embodiment as well as in the first embodiment, the processing apparatus 1 performs the above-described plasma etching process once or multiple times (step 21). Then, a plasma of a gas which is easily ionized, e.g., Ar gas, is generated and sputtering using $Ar^+$ ions is performed (step 22). Accordingly, Cl is removed from the surface of the gas supply line. In that case, since the passive film becomes in a state where Cr is unstable after the removal of Cl. Therefore, the chamber 2 is purged by supplying oxygen gas ($O_2$ gas) or dry air (D-Air) into the chamber 2 through the gas supply line 10 (step 23). Accordingly, the passive film is reoxidized. Thereafter, the chamber 2 is opened and exposed to the atmosphere (step 24).

Figures 8A, 8B, 8C, 8D:
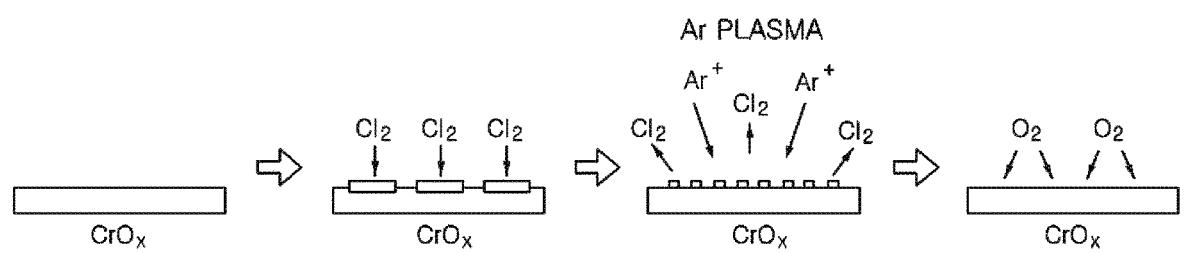
FIGS. 8A to 8D schematically show a corrosion inhibition model in the third embodiment.

FIGS. 8A and 8D show the corrosion inhibition model of the present embodiment. In other words, when $Cl_2$ gas is adhered to the surface as shown in FIG. 8B in a state where the passive film ($CrO_x$) is generated as shown in FIG. 8A, $CrCl_x$ is generated locally. Therefore, a plasma of Ar gas is generated in the chamber as shown in FIG. 8C before the chamber is opened and exposed to the atmosphere and the Cl component is removed from the surface by sputtering the surface of the gas supply line by $Ar^+$ ions. At this time, the ions reach the inside of the passive film and, thus, the passive film becomes in a state where Cr is unstable. Therefore, as shown in FIG. 8D, the original state is obtained by reoxidizing the passive film by oxygen gas ($O_2$ gas) or by dry air. The ions such as $Ar^+$ ions or the like have a great effect in removing Cl components, and thus can remove the Cl components effectively.

When the sputtering using the ions such as $Ar^+$ ions or the like is performed, the step 22 and the step 23 may be performed simultaneously by supplying oxygen gas ($O_2$ gas) into the chamber.

Processing Method According to Fourth Embodiment of the Present Invention

Next, a processing method according to a fourth embodiment of the present invention will be described.

Figure 9:
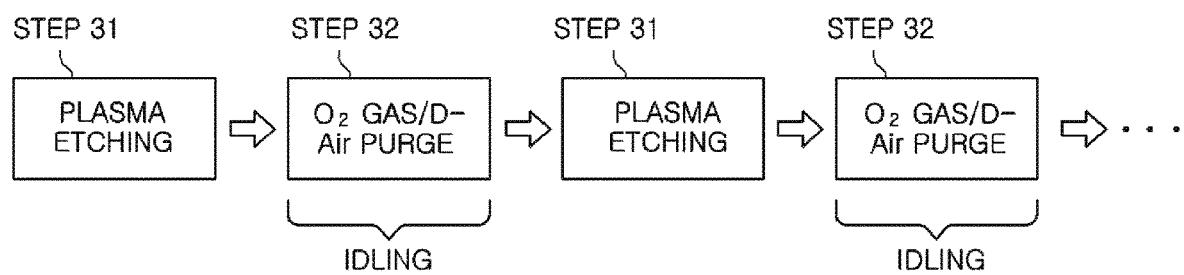
FIG. 9 is a flowchart showing a processing method according to a fourth embodiment of the present invention.

In the present embodiment, as shown in FIG. 9, when the above-described plasma etching process is repeatedly performed multiple times in the chamber 2 (step 31), the chamber is purged by supplying oxygen gas ($O_2$ gas) or dry air (D-Air) into the chamber 2 through the gas supply line during idling between completion of a single plasma etching process and a plasma etching process of a next wafer (step 32). This is continued during a series of processes up to the exposure to the atmosphere.

As described above, the passive film is slightly corroded by $Cl_2$ gas that is a halogen-based gas during the plasma etching process performed in a vacuum state. However, it is possible to remove $Cl_2$ adhered to the surface of the gas supply line by performing a purge process using oxygen gas or dry air instead of a conventional purge process using $N_2$ gas during idling between plasma etching processes, and also possible to restore the passive film to the original sound state by reoxidizing the passive film on the surface of the gas supply line while setting an atmosphere in the gas supply line to an oxygen-containing atmosphere. Accordingly, it is possible to effectively suppress the corrosion of the passive film by the halogen-based gas. By performing the purge process using oxygen gas or dry air during the idling, it is also possible to suppress the corrosion of the passive film when the chamber is opened and exposed to the atmosphere.

In the present embodiment, it is preferable that oxygen gas or dry air which contains substantially no moisture is used for the purge process. The concentration of moisture at that time is preferably 0.5 ppm or less.

Figure 10A:
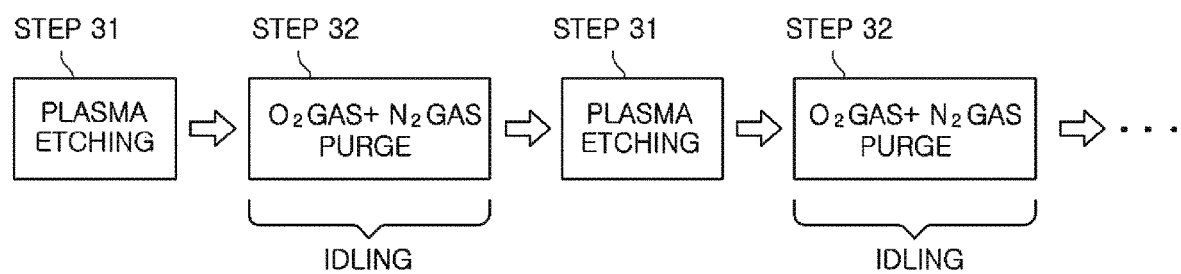
FIG. 10A is a flowchart showing a processing method according to a modification of the fourth embodiment.
Figure 10B:
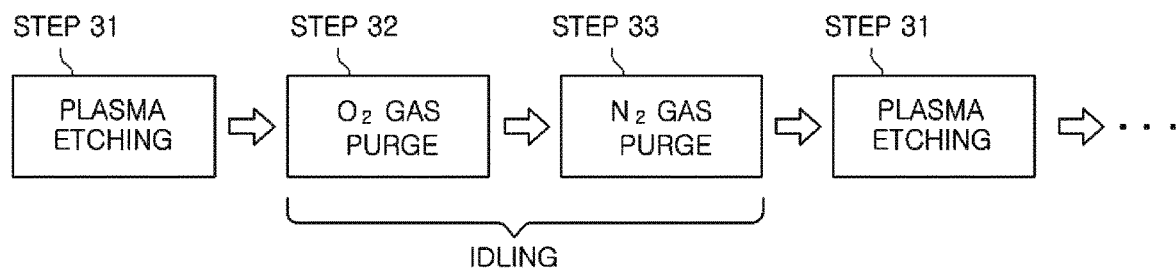
FIG. 10B is a flowchart showing a processing method according to another modification of the fourth embodiment.

In the case of using oxygen gas ($O_2$ gas) as the purge gas, a mixture of $O_2$ gas and $N_2$ gas may be used in the step 32 in order to reduce the amount of expensive oxygen gas ($O_2$ gas) as shown in FIG. 10A. Further, it is possible to perform the purge process using $O_2$ gas for a predetermined period of the idling (step 32) and then perform the purge process using $N_2$ gas (step 33) during a remaining period of the idling as shown in FIG. 10B.

When the purge process of the step 32 is performed, a rare gas such as Ar gas or the like may be used, instead of $N_2$ gas, as an inactive gas mixed with oxygen gas ($O_2$ gas). Further, in addition to the purge process using oxygen gas or the like which is performed during the idling, the purge process and the plasma processing before exposure to the atmosphere may be performed as in the first to the third embodiment.

TEST EXAMPLE

A plurality of test pieces made of stainless steel (SUS) was prepared and exposed to chlorine gas ($Cl_2$). A part of the test pieces were stored for 72 hours under a nitrogen gas ($N_2$ gas) atmosphere and the remaining test pieces were stored for 72 hours under a dry air (D-Air) atmosphere in which the concentration of moisture is 0.5 ppm or less, i.e., in which substantially no moisture exists.

Figure 11:
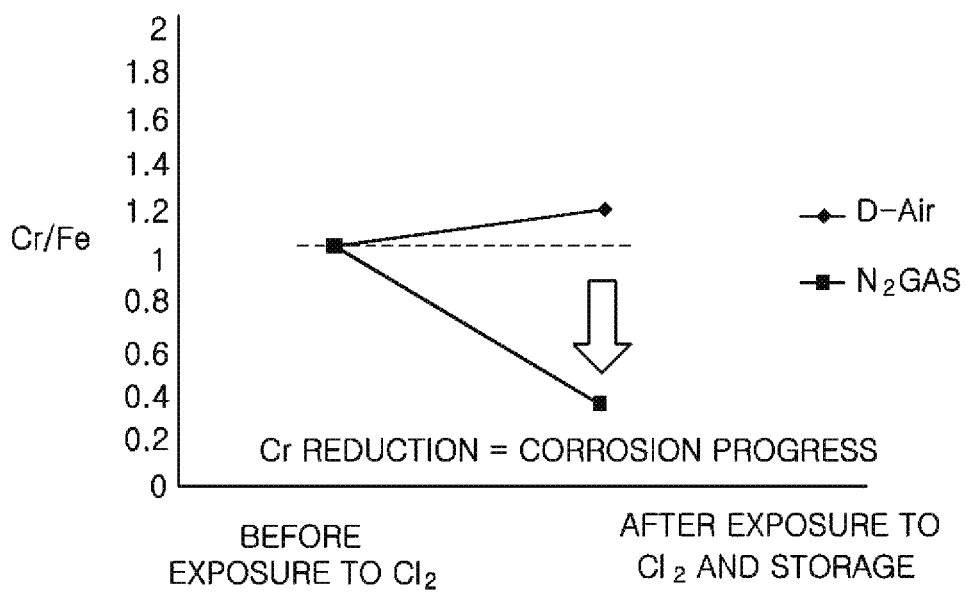
FIG. 11 shows values of chromium/iron before exposure and after exposure and storage in the case of exposing test pieces made of stainless steel to chlorine gas and storing the test pieces under a nitrogen gas atmosphere and under a dry air atmosphere.
Figure 12:
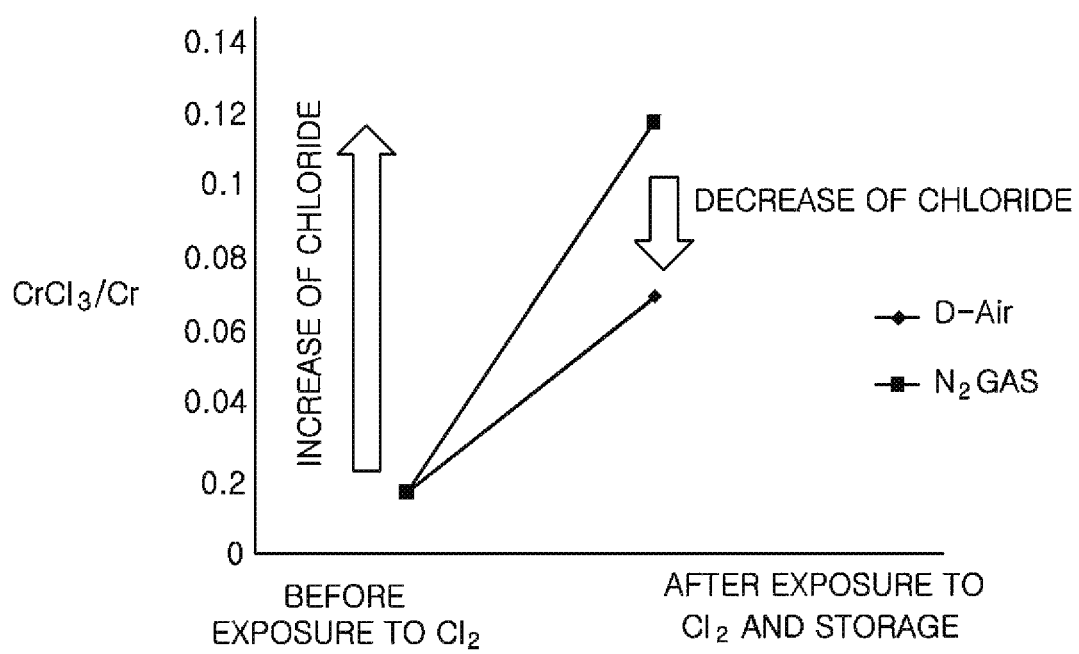
FIG. 12 shows values of chromium chloride/chromium before exposure and after exposure and storage in the case of exposing test pieces made of stainless steel to chlorine gas and storing the test pieces under a nitrogen gas atmosphere and under a dry air atmosphere.

The test pieces before the exposure to $Cl_2$ and after the exposure to $Cl_2$ and the storage were analyzed by TOF-SIMS. The results thereof are shown in FIGS. 11 and 12. FIG. 11 shows the result of chromium/iron (Cr/Fe) and FIG. 12 shows the result of chromium chloride/chromium ($CrCl_3$/Cr).

As shown in FIG. 11, the ratio of Cr in the test pieces stored under the $N_2$ atmosphere was decreased, whereas the ratio of Cr was not decreased in the test pieces stored under the D-Air atmosphere containing oxygen. As shown in FIG. 12, a ratio of Cr chlorided was lower in the test pieces stored under the D-Air atmosphere containing oxygen than in the test pieces stored under the $N_2$ gas atmosphere. From this, it is clear that the corrosion of the passive film is suppressed in the case of storing the test pieces under the D-Air atmosphere containing oxygen after the exposure to $Cl_2$.

(Other Applications)

The present invention is not limited to the above embodiments and may be variously modified within the scope of the present invention. For example, in the above embodiments, the example of suppressing the corrosion of the passive film of the gas supply line made of stainless steel is described. However, the present invention is also effective in suppressing the corrosion of a stainless steel screw that is an in-chamber component or a stainless steel spiral tube for ensuring conductivity. The present invention may be applied not only to a passive film made of stainless steel but also to other films of oxides such as aluminum oxide ($Al_2O_3$), yttrium oxide ($Y_2O_3$) and the like which are formed on the surface of the chamber, the surface of the gas supply line and the like. In that case as well, the same corrosion inhibition effect can be obtained.

In the above embodiments, $Cl_2$ gas is used as the halogen-based gas. However, the same effect can be obtained in the case of using other gases containing a halogen element of F, Cl, Br or I, such as HBr gas and the like.

Further, in the above embodiments, the plasma etching process is described as an example of a process using a halogen-based gas. However, the present invention is not limited thereto and may be applied to other processes using a halogen-based gas, such as a film forming process and the like.

DESCRIPTION OF REFERENCE NUMERALS

1: processing apparatus
2: chamber
2a: main body
2b: lid
4: mounting table
7: high frequency power supply
8: shower head
9: gas inlet
10: gas supply line
11: gas exhaust line
12: gas exhaust unit
W: semiconductor wafer (target object)

What is claimed is:
1. A processing method in a processing apparatus which performs a process on a target object by supplying a halogen-based gas through a gas supply line into a chamber while maintaining the chamber in a vacuum state, with an oxide film formed on a surface of the chamber or on a surface of the gas supply line, the method comprising:
performing the process on a target object in the chamber once or multiple times;

removing halogen-based components of the halogen-based gas adhered to the oxide film on the surface of the chamber or on the surface of the gas supply line and reoxidizing corroded oxide film on the surface of the chamber or on the surface of the gas supply line, by supplying oxygen gas into the chamber, without using plasma, through the gas supply line; and exposing the chamber to an atmosphere, wherein a concentration of moisture in the oxygen gas supplied into the chamber is 0.5 ppm or less.

2. The processing method of claim 1, wherein an ion sputtering process is performed together with or before said removing and reoxidizing.

3. The processing method of claim 2, wherein the ion sputtering process is performed by using argon ions obtained by generating a plasma of argon gas.

4. The processing method of claim 1, wherein the halogen-based gas is chlorine gas.

5. The processing method of claim 1, the gas supply line is made of stainless steel, and the oxide film is a passive film made of chromium.

6. A processing method in a processing apparatus which performs a process on a target object by supplying a halogen-based gas through a gas supply line into a chamber while maintaining the chamber in a vacuum state, with an oxide film formed on a surface of the chamber or on a surface of the gas supply line, the method comprising:

performing the process on a target object in the chamber once or multiple times;

removing halogen-based components of the halogen-based gas adhered to the oxide film on the surface of the chamber or on the surface of the gas supply line and reoxidizing corroded oxide film on the surface of the chamber or on the surface of the gas supply line, by generating oxygen plasma in the chamber while supplying only oxygen gas into the chamber through the gas supply line; and exposing the chamber to an atmosphere, wherein the halogen-based gas is chlorine gas.

7. The processing method of claim 6, the gas supply line is made of stainless steel, and the oxide film is a passive film made of chromium.

8. A processing method in a processing apparatus which performs a process on a target object by supplying a halogen-based gas through a gas supply line into a chamber while maintaining the chamber in a vacuum state, with an oxide film formed on a surface of the chamber or on a surface of the gas supply line, the method comprising:

performing the process on a target object in the chamber multiple times while maintaining the chamber in a vacuum state; and performing idling between the processes performed multiple times, wherein during said idling, removal of halogen-based components of the halogen-based gas adhered to the oxide film on the surface of the chamber or on the surface of the gas supply line and reoxidization of corroded oxide film on the surface of the chamber or on the surface of the gas supply line are performed by supplying oxygen gas into the chamber, without using plasma, through the gas supply line, wherein a concentration of moisture in the oxygen gas supplied into the chamber is 0.5 ppm or less.

9. The processing method of claim 8, wherein the removal and reoxidization performed during said idling are performed by the oxygen gas mixed with nitrogen gas.

10. The processing method of claim 8, wherein the removal and reoxidization are performed by oxygen gas for a predetermined period of the idling and by nitrogen gas for a remaining period of the idling.

11. The processing method of claim 8, wherein the halogen-based gas is chlorine gas.

12. The processing method of claim 8, the gas supply line is made of stainless steel, and the oxide film is a passive film made of chromium.

\* \* \* \* \*